(12) United States Patent
Markley et al.

(10) Patent No.: US 11,831,293 B2
(45) Date of Patent: Nov. 28, 2023

(54) FREQUENCY-SELECTIVE PLANAR RADIO FILTER

(71) Applicant: CLD WESTERN PROPERTY HOLDINGS LTD., Kelowna (CA)

(72) Inventors: Loïc Markley, Kelowna (CA); Nibirh Jawad, Kelowna (CA); Andrew Joseph William Gaucher, Kelowna (CA)

(73) Assignee: CLD Western Property Holdings Ltd., Kelowna (CA)

( * ) Notice: Subject to any disclaimer, the term of this patent is extended or adjusted under 35 U.S.C. 154(b) by 409 days.

(21) Appl. No.: 17/259,421

(22) PCT Filed: Jul. 11, 2019

(86) PCT No.: PCT/CA2019/050956
§ 371 (c)(1),
(2) Date: Jan. 11, 2021

(87) PCT Pub. No.: WO2020/010460
PCT Pub. Date: Jan. 16, 2020

(65) Prior Publication Data
US 2021/0328567 A1    Oct. 21, 2021

Related U.S. Application Data

(60) Provisional application No. 62/696,543, filed on Jul. 11, 2018.

(51) Int. Cl.
*H03H 7/01* (2006.01)
*H01Q 15/00* (2006.01)
*H01Q 19/08* (2006.01)

(52) U.S. Cl.
CPC ...... *H03H 7/1783* (2013.01); *H01Q 15/0013* (2013.01); *H01Q 19/08* (2013.01)

(58) Field of Classification Search
CPC . H03H 7/1783; H01Q 15/167; H01Q 15/0013
USPC ......................................................... 343/909
See application file for complete search history.

(56) References Cited

U.S. PATENT DOCUMENTS

| | | | |
|---|---|---|---|
| 9,065,180 B2 | 6/2015 | De Barros et al. | |
| 2001/0024151 A1 | 9/2001 | Mizoguchi et al. | |
| 2003/0071763 A1* | 4/2003 | McKinzie, III | H01Q 15/0013 343/754 |
| 2005/0012677 A1 | 1/2005 | Brown et al. | |
| 2008/0150691 A1 | 6/2008 | Knadle et al. | |

(Continued)

*Primary Examiner* — Rakesh B Patel
(74) *Attorney, Agent, or Firm* — McCarthy Tétrault LLP

(57) ABSTRACT

A planar radio frequency filter is described, comprising a frequency selective surface (FSS) applied to a substrate. The filter blocks the transmission of electromagnetic waves in at least two independent radio frequency bands. The FSS comprises a periodic array of multipole inclusions with skewed or forked poles to increase packing density. The inclusions comprise four or six primary poles to generate the lower frequency resonance and an additional four or six secondary poles to generate the higher frequency resonance. The secondary inclusions are located between the primary inclusions to tune the higher resonance frequency. The FSS incorporates overlapping parallel conducting segments that overlap to provide an inductive-capacitive path between adjacent inclusions.

31 Claims, 8 Drawing Sheets

(56) References Cited

U.S. PATENT DOCUMENTS

2011/0210903 A1* 9/2011 Sarabandi .......... H01Q 15/0086
                                                    343/904
2019/0058258 A1* 2/2019 Takikawa ............. H01Q 15/147

* cited by examiner

FREQUENCY-SELECTIVE PLANAR RADIO FILTER

RELATED APPLICATIONS

This application claims priority from U.S. Provisional Patent Application No. 62/696,543 filed on Jul. 11, 2018 entitled "Frequency-Selective Planar Radio Filter". This application claims the benefit under 35 USC § 119 of U.S. application No. 62/696,543 filed Jul. 11, 2018 entitled "Frequency-Selective Planar Radio Filter", which is incorporated herein by reference in its entirety.

FIELD OF INVENTION

The present disclosure relates generally to radio frequency (RF) technology, and more particularly to planar structures for filtering RF signals.

BACKGROUND

The development of wireless communication technologies have enabled the deployment of reliable wireless communication networks, permitting ease of mobility for users of the network and reducing the physical infrastructure for the network operator.

As with any communication network, wireless communication networks may be used to transmit or receive sensitive or confidential information to which access should be limited or controlled. Accordingly, network security is a concern in respect of wireless communication networks, and perhaps more so than traditional wired networks, as a communication signal containing sensitive information may be intercepted by a device within receiving range of a source of the wireless communication signal.

Current security protocols for wireless communication networks include use of password protection and encryption schemes. However, if the password can be obtained or the encryption scheme is compromised, data traffic and all information transmitted or received within the wireless communications channels of the wireless network would be susceptible to interception and eavesdropping.

Within office and residential buildings, wireless communication signals, such as WiFi signals, are often used to deliver communication signals between a wireless router and the devices on its wireless local area network (LAN). These routers are often located in close proximity to one another, such that a device connected to one WiFi network, for example, may also be within range of routers on other WiFi networks. The overlapping ranges of wireless networks may make a network more vulnerable to security attacks. As well, since most wireless networks are operated within a narrow frequency range, the wireless signals on different networks may interfere with one another. Interference can also result from a wireless router using the same or overlapping channels as another wireless router. Interference can result in reduced range of a wireless network, fluctuations in signal strength, drops in transfer speed, or the wireless signal cutting out. These issues may be exacerbated within buildings where offices and residences share walls with one another, since WiFi signals are typically able to pass through a wall from one room to the next.

As such, there is a need for solutions for addressing or ameliorating at least some of the problems identified above, including, for example, security and interference-related concerns with respect to wireless communication networks.

SUMMARY OF THE DISCLOSURE

In general, the present specification describes apparatus and methods for filtering and enhancing wireless communication signals using a conductive planar structure. The planar structure may be provided in paper or other planar, non-conductive substrate to provide a filter that can be mounted as wallpaper to a wall of a room or building.

According to one broad aspect of the invention, there is provided a planar radio frequency filter. The filter includes a frequency selective surface (FSS) configured to block the transmission of electromagnetic waves in at least two independent radio frequency bands. The FSS further includes a periodic array of multipole inclusions, wherein the inclusions comprise four or six primary poles to generate a lower frequency resonance and an additional four or six secondary poles to generate a higher frequency resonance.

In some embodiments, the inclusions comprise parallel overlapping conducting segments between adjacent inclusions to provide an inductive-capacitive path between the adjacent inclusions. In other embodiments, the inclusions are arranged with skewed poles to increase packing density of the inclusions.

In some embodiments, the inclusions comprise primary and secondary inclusions, the secondary inclusions located between the primary inclusions to tune the higher frequency resonance. In other embodiments, the primary and/or secondary inclusions may further comprise forked or non-forked multipole elements.

In some embodiments, the FSS comprises a planar conductive material. In some embodiments, the filter comprises a flexible or rigid non-conductive substrate, wherein the FSS is disposed on the substrate. The substrate can be one or more of paper, textile, vinyl, acrylic and plastic, and the filter is applied as wallpaper to a wall.

According to another broad aspect of the invention, there is provided a method for manufacturing a filter to selectively block transmission of electromagnetic waves. The method includes providing a non-conductive planar substrate and applying a conductive frequency selective surface (FSS) to the planar substrate, wherein the FSS is configured to block the transmission of electromagnetic waves in at least two independent radio frequency bands, the FSS comprising a periodic array of multipole inclusions, the inclusions having four or six primary poles to generate a lower frequency resonance and an additional four or six secondary poles to generate the higher frequency resonance.

In some embodiments, the inclusions of the filter comprise parallel overlapping conducting segments between adjacent inclusions to provide an inductive-capacitive path between the adjacent inclusions. In other embodiments, the inclusions comprise skewed poles to increase packing density.

In some embodiments, the method further includes providing secondary inclusions located between primary inclusions to tune the higher frequency resonance. In other embodiments, the primary and/or secondary inclusions may further comprise forked or non-forked multipole elements.

In some embodiments, providing the substrate comprises providing one or more of a sheet of paper, textile, vinyl, acrylic and plastic as the substrate.

In some embodiments, applying the FSS to the substrate comprises printing the FSS on the substrate using a printer with conductive ink.

Additional aspects of the present invention will be apparent in view of the description which follows.

BRIEF DESCRIPTION OF THE DRAWINGS

Features and advantages of the embodiments of the present invention will become apparent from the following detailed description, taken with reference to the appended drawings in which.

DETAILED DESCRIPTION

Figure 1A:
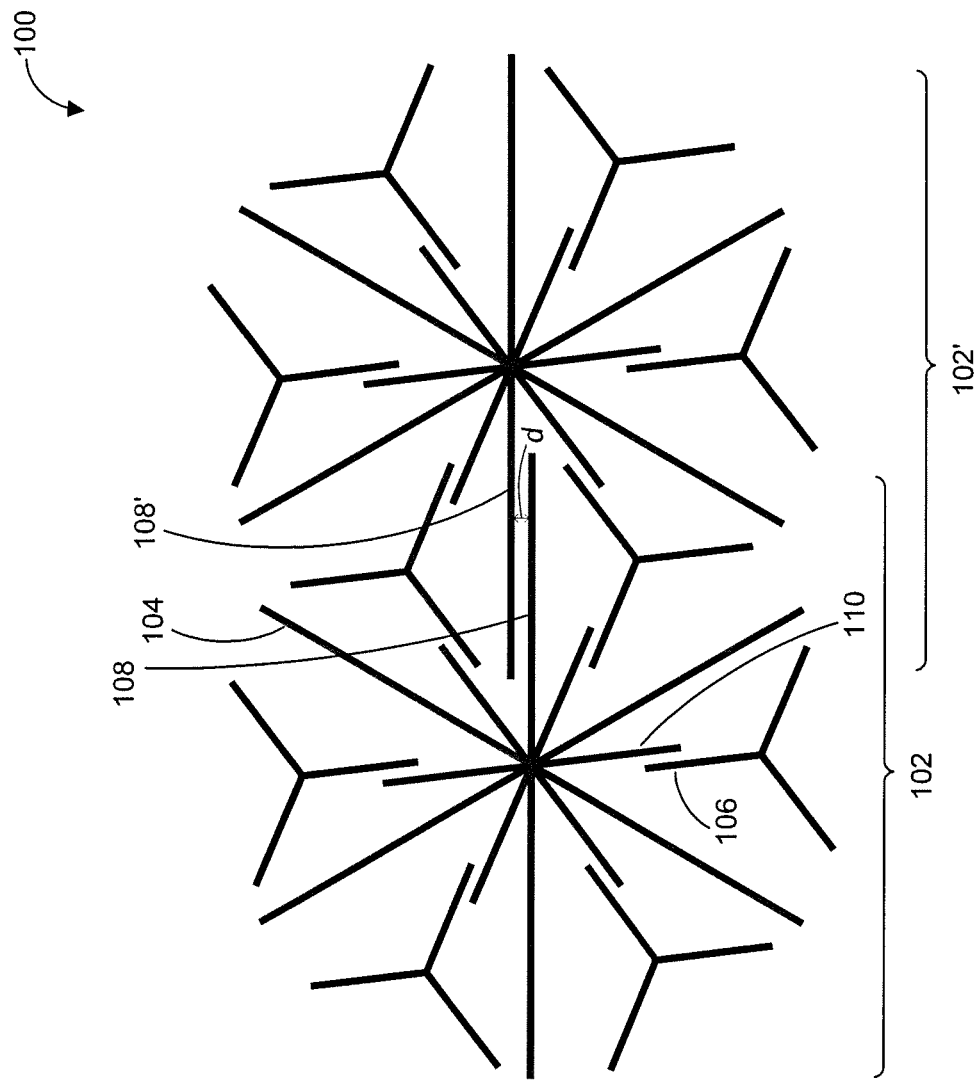
FIG. 1A is a plan view of a frequency-selective planar radio filter with interleaved 12-pole stars according to one embodiment of the invention.

The description which follows, and the embodiments described therein, are provided by way of illustration of examples of particular embodiments of the principles of the present invention. These examples are provided for the purposes of explanation, and not limitation, of those principles and of the invention.

In the context of a wireless communication network, also referred to herein as a "wireless network", building a secure network generally involves configuring the network so that the wireless communication channels established according to a given communication protocol used in the wireless network is inaccessible to unauthorized personnel. Methods of preventing unauthorized access to a communication channel may include implementing password protection, encrypting the data communicated on the channel, and the like. However, these security measures may be compromised or "hacked" by rogue actors with physical access to the radio frequency (RF) signals associated with the wireless network (e.g., by being located within transmitting range of a wireless signal source), which may result in the data communicated within the communication channels being open to eavesdropping.

There are many wireless communication protocols available that enable users of wireless devices to access network services such as voice and data services. For example, voice communication and Internet access can be provided over wide-area mobile networks such as cellular EDGE, UMTS, HSPA or LTE data networks, and the like. Similarly, wireless local area networks such as IEEE 802.11-compliant wireless networks, often called "WiFi" networks, are available to provide access to similar services to devices on the local area network.

Local area WiFi networks are nearly ubiquitous and are available at homes, offices, and in public places including shopping centres and restaurants. Often, such networks are not managed professionally to ensure that appropriate security safeguards and practices are implemented. These networks are therefore open to attacks. Security researchers have recently identified numerous security vulnerabilities in the WiFi protocol including the "key reinstallation attacks" (KRACKs) for the WPA2 encryption protocol, which is known to work against all protected WiFi networks. This attack allows rogue actors to read information that was previously presumed to be encrypted, allowing such actors to obtain messages and information transmitted within a secured WiFi network, such as chat messages, photos, emails, passwords and the like, "in-the-clear".

In view of the vulnerabilities of these communication protocols, one way to further protect a wireless network is by physically preventing access to the radio signals associated with the wireless network. This concept is similar to implementing an "air gap" or "air wall" for wired networks to ensure that the wireless network is physically separated from another wireless network or potential attackers. By preventing physical access to the wireless network, the rogue actors would be prevented from deploying the various known attacks against the wireless network.

Some physical RF barriers use frequency selective surfaces (FSS). An FSS is a two dimensional periodic (i.e., repeated) structure that produces a filtering effect on incident electromagnetic waves. Each repeated element can be regarded as a unit cell having particular geometries to produce a desired filtering behaviour. Specifically, FSS-based devices have seen many applications as free-space filters across the electromagnetic spectrum. Their frequency selectivity has been used to design radomes, multiband antennas, and electromagnetic absorbers. Four general types of filters can be designed using arrays of four basic conductive shapes or geometries applicable to a unit cell: low-pass filters using plates or patches, high-pass filters using meshes, band-pass filters using slots, and band-stop filters using loops or strips. Paints, fabrics, and window films have been used to create electromagnetically shielded rooms in this fashion. These surfaces, however, are all single band filters and therefore cannot distinguish one type of wireless signals (e.g. WiFi signals) from other types wireless signals (e.g. radio and television signals, cellular network signals). These surfaces would also block all communication signals, including those from cellular networks and across emergency bands, transmitted at frequencies that fall outside of the filter's passband.

A multiband FSS, which combines one or more basic filter types to actuate simultaneous filtering at multiple frequency bands, is therefore desirable to address at least the foregoing deficiency. Fabrication of multiband filters typically requires stacking multiple FSS layers together. However, such multilayer patterning and construction is often costly for a commercial retail wall covering application. In view of the foregoing, it is desirable to have a passive single-layer filter that is low-profile, low-cost and may be easily integrated into existing physical structures.

A challenge with single-layer topologies, however, is achieving a frequency response having multiple wide resonance bands (e.g. stop bands) that are stable over a range of angles of incidence and various waveform polarizations. Additionally, tightly-coupled multi-resonant elements are typically required for multi-band filtering; however, this comes at the cost of increased design complexity where both resonance frequencies must be tuned simultaneously. Existing single-layer multiband band-stop FSS designs have introduced additional bands through the use of supercells and lattice perturbations, element perturbations, fractal elements, and multi-resonant elements. The incorporation of one or more of the foregoing features further increase the overall complexity and production costs associated with the filter.

Described in the present disclosure is a passive multi-band FSS RF device, implemented in a single-layer topology, operable to filter or block RF signals of desired frequencies so as to geographically limit the distances an RF signal can propagate. The device includes a planar patterned conductive structure that can be applied onto a suitable substrate to provide a dual-stop-band electromagnetic wave filter in a single layer that is optimized for high bandwidth at the −20 dB attenuation level. As described in greater detail herein, the substrate material can be any suitable material needed to provide either a stiff or flexible substrate. Such a planar or thin conducting surface is opaque to RF signals and can act like a Faraday cage to prevent a wireless network from extending outside a home or building.

If the desired frequency selectivity of a surface is known, equivalent circuit techniques can be used to develop a periodic FSS pattern which will have resonances occurring at the required frequencies. Conductive strips and gaps aligned with a propagating electric field can act as inductances and capacitances, respectively. Hence, with a suitably designed geometry, multiple inductor-capacitor (LC) paths can be created in the direction of the incident electric field to resonate at the desired frequencies. The FSS pattern can be designed to provide control over the positions of the transmission poles and zeros as well as rotational symmetry to ensure polarization independence. However, due to space constraints in a single-layer design, it may be difficult to achieve equal bandwidths in each stop band. As will be explained in greater detail subsequently, edge-coupled conductive strips and interdigitated intermediate structures can produce the required transmission characteristics of the FSS with large bandwidths in both stop bands.

For explanatory purposes of the present disclosure, the WiFi wireless networking protocol is used to describe the various embodiments of the disclosed invention. However, embodiments of the invention may be modified or adapted to filter frequencies relevant to other wireless communication protocols. Also for the purposes of this disclosure, where the transmission of an RF signal through the device is reduced, either by way of reflection or absorption, it may be said that the transmission of the signal is being attenuated.

Figure 1B:
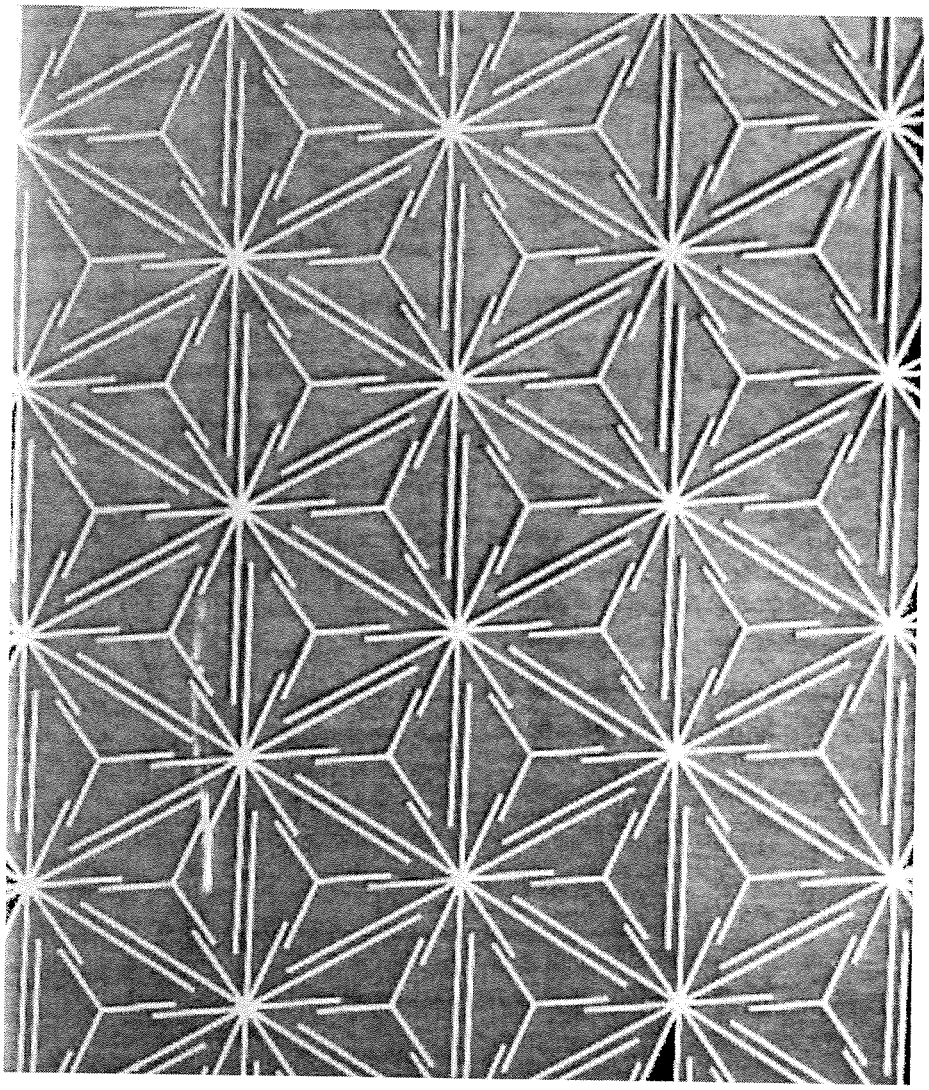
FIG. 1B is a plan view of the frequency-selective filter of FIG. 1A repeated along multiple rows and columns on a planar substrate.

FIG. 1A is a plan view of the design of the planar structure 100 of a filter for WiFi wireless networks according to an embodiment of the invention. More generally, the design of FIG. 1A can be regarded as a FSS operable to block the transmission or propagation of electromagnetic waves at multiple radio frequency bands. The WiFi wireless protocol in common use operates at frequency bands around 2.4 GHz and 5.8 GHz. Within a given frequency band, the band is divided into a multitude of channels in which data is communicated between a transmitting and a receiving device. In the FIG. 1A embodiment, the FSS incorporates two unit structures 102 and 102' in an interleaved arrangement that produces dual resonances. Thus, the interleaved unit structures 102, 102' are operable to reduce the transmission of RF signals through the filter at more than one target frequency (e.g., at the frequencies relevant to the WiFi wireless protocol, such, as for example, frequency bands around 2.4 GHz and 5.8 GHz). This interleaved design can be repeated along multiple rows and columns in a planar substrate to provide a planar RF filter as shown in the alternate embodiment of FIG. 1B. The operation of the structures is passive, and does not require a power source.

Each of the two illustrated unit structures 102 and 102' comprises one centre-connected 12-pole star 104 and six centre-connected tripole stars 106 (hereinafter "tripole"). Each of the star-shaped structures includes arms or poles that extend radially from a common centre. The 12-pole star 104 can be regarded as comprising two separate hexapole structures (i.e., a 6-pole star). One hexapole 108 has longer primary arms, and is referred to herein as the "primary hexapole". In the illustrated embodiment, the angle between each pair of adjacent longer arms is equal, providing equal circumferential spacing or distance between adjacent arms. In other embodiments, the circumferential spacing is varied so that the spacing or distance between adjacent pairs of primary arms is not the same. As described in more detail herein, the arms of the primary hexapole 108 may be denoted as the primary resonance branch having a primary resonance frequency corresponding to a first frequency for which attenuation is desired.

The other hexapole 110 has shorter arms relative to those of the primary hexapole 108, and is referred to herein as the "secondary hexapole". The primary and secondary hexapoles 108 and 110 share a common centre located on the substrate. In the illustrated embodiment, the secondary hexapole 110 is angularly offset relative to the primary hexapole 108 so that the shorter arms of the secondary hexapole 110 are positioned between the longer arms of the primary hexapole 108. As will be described in more detail subsequently, the arms of the secondary hexapole 110 may be denoted as the secondary resonance branch having a secondary resonance frequency corresponding to a second frequency for which attenuation is desired. The primary hexapole 108 and secondary hexapole 110 may be referred to as multipole inclusions. A plurality of hexapoles 108, 110 may be arranged in an array with "skewed" poles. In other words, as described herein and shown in FIG. 1A, a primary hexapole 108 and a secondary hexapole 110 are arranged so as to have a common centre with the secondary hexapole 110 being angularly offset relative to the primary hexapole 108, the result being that the poles are arranged in a star formation (i.e., radiating from a common centre) with the poles of the primary hexapole 108 being skewed from the poles of the secondary hexapole 110. One of the advantages of such an arrangement is to increase or maximize packing density of the multipole inclusions.

As noted previously, unit structures 102 and 102' of the FIG. 1 embodiment also comprise six centre-connected tripole stars 106. Each of the tripoles 106 comprises arms of the same length to provide symmetry of design. Furthermore, each of the tripoles 106 is shared between adjacent longer arms of the primary hexapole 108 of the 12-pole star 104. In the embodiment shown, the angles between each arm of the tripole 106 are equal, providing equal circumferential spacing or distance between adjacent tripole arms. In other embodiments, the circumferential spacing varies so that the spacing or distance between adjacent pairs of tripole arms is not the same.

As noted previously, the unit structures 102 and 102' shown in FIG. 1A are planar and made of a conductive material. The rectilinear arms of the unit structures 102 and 102' can be printed onto a non-conductive substrate using a printer with conductive ink. For example, the described unit structures 102 and 102' can be printed with commercially available silver ink (such as Metalon™ HPS-FG57B) using a screen printing technique. Inkjet printing, roller printing, conductive printing, or any other suitable printing technique known to those skilled in the art could also be used. The fabricated filter therefore comprises a single layer of conductive material over a substrate material. Alternatively, the substrate can be treated with light-sensitive conductive materials so that the design can be fabricated using lithographic techniques. The substrate can be paper (smooth or textured), textile, acrylic, vinyl, or flexible plastic sheets such as PET (polyethylene terepthalate) sheets of various thicknesses (including substrates used to fabricate flexible printed circuit boards), or any other suitable non-conductive material.

In designing the structure, the widths of the conductive segments may be limited by the printing capabilities of the printing device or the printing technique. In some implementations, a physical limit or a minimum feature size can be set to obtain consistent rectilinear segments. For example, for certain printing techniques used to fabricate the embodiments of FIGS. 1A and 2, the minimum width is 0.5 mm and the minimum gap is 0.84 mm. If a specific width is required due to printing limitations, the lengths of the tripole 106 and hexapoles 108 and 110 can be altered to compensate for any changes in thickness of the arms/poles as defined by the set width.

Flexible sheets with these planar structures printed thereon can be applied as wallpaper to various walls in a room or building such that they become WiFi blocking wallpaper. The wallpaper may be affixed to the wall using known methods, such as a suitable wallpaper adhesive, for example. These flexible sheets can also be used to wrap around, or be affixed to, curved surfaces. Such WiFi-blocking wallpaper can reduce or block WiFi signals emanating from a transmitter in a room, thereby preventing WiFi signals from propagating beyond the walls of the room. For complete shielding, all surfaces, including the ceilings, floors, and windows could be covered with the wallpaper made using an opaque or optically clear substrate. The same WiFi blocking wallpaper may reduce or block external WiFi signals from propagating into the room. In other embodiments, the described structures can be printed on a stiff substrate such as FR4 or drywall to provide filters that can be embedded into the infrastructure of a building. The embedded nature of the filter may prevent the filter from being tampered with (e.g., by way of tearing down the wallpaper).

Accordingly, application of the WiFi blocking wallpaper to rooms within a building would enable a building to have secure wireless areas, outside of which the network will be inaccessible due to low or reduced signal strength. The WiFi blocking wallpaper can be integrated into existing structures to produce "WiFi secured rooms". For those concerned with the health effects of radio frequency signals, the structures can limit the exposure of WiFi signals from entering certain spaces within their home, such as bedrooms or children's rooms.

Additionally, the nature of the WiFi blocking wallpaper may also enhance the signal quality of a WiFi network (e.g., the signal strength) within a WiFi secured room. In one manner of operation of the wallpaper, the wireless signals propagating from within the WiFi secure room may reflect off the wallpaper back towards its source. Similarly, WiFi signals originating from outside of the WiFi secured room would be prevented from propagating into the WiFi secured room. Hence, the signal strength inside the WiFi secured room can be enhanced by way of reduced cross channel interference between wireless networks using the same communication channel but sourced from different locations (e.g., served by different network access points). Since the network inside a WiFi secured room would only be sourced inside the room, any other signals external to the WiFi secured room would not be available inside the room to produce interference.

As noted above, the design of the planar structure 100 of the filter incorporates interleaved unit structures 102 and 102', and more specifically interleaved 12-pole star structure 104 in the embodiment of FIG. 1A. The inventors have found that their 12-pole structure 104 in combination with the intermediate tripoles 106 is operable to produce dual resonances, as described herein, on a single layer of substrate material, while the interleaving of the structures allows a relatively large primary resonance filtering bandwidth (i.e., greater than 15%, as described in greater detail in conjunction with FIG. 3 subsequently) in a single layer design. In the FIG. 1A embodiment, at least one arm of a primary hexapole 108 is interleaved with at least one arm of another primary hexapole 108' of an adjacent unit structure 102' in a skewed lattice arrangement. The interleaved arms 108 and 108' shown in FIG. 1A are arranged to be substantially parallel to each other along a horizontal direction in a plane defined by the structures. Respective portions of the arms 108 and 108' that are located adjacent and parallel to each other may be said to "overlap" with one another along a horizontal direction in the plane defined by the planar FSS structures. Furthermore, the skewed lattice arrangement is intended to help maximize the overlap between arms of adjacent elements. The word "overlap", as used herein to describe overlapping conductive segments of adjacent structures, is not intended to suggest that these conductive segments make direct physical contact with each other anywhere along the overlapping portions. In particular, while arms 108 and 108' are in close proximity to one another along the overlapping parallel portions, there is maintained a gap of width d that separates arms 108 and 108', as shown in FIG. 1A. With a dielectric located in the gap (e.g., air), the overlapping parallel portions of arms 108, 108' enables inductive-capacitive coupling between adjacent unit structures 102 and 102'. In the present example, the amount of overlap of the arms 108 and 108' can be adjusted along the horizontal direction in the plane, and the degree of separation of the arms 108 and 108' can be adjusted in a direction transverse to the horizontal direction.

In the FIG. 1A embodiment, each arm of the secondary hexapole 110 is interleaved with an arm of a tripole 106. A tripole 106 can be interleaved with up to three adjacent unit structures (i.e., one for each of the tripole arms). The interspaced tripole 106 elements provide a secondary resonance path for dual band operation. The interleaving arms of the tripole 106 and secondary hexapole 110 are arranged so as to be substantially parallel to each other along a horizontal direction in the plane defined by these structures. Respective portions of the arms that are parallel and adjacent to each other may be said to overlap with each other along a horizontal direction, with the overlapping portions of the conductive segments (i.e., the interleaving arms of tripole 106 and secondary hexapole 110) separated by a gap, which contains a dielectric (e.g., air). This provides a secondary inductive-capacitive path between unit cells 102 and 102'. The degree of overlap and separation between the arms can be adjusted as desired.

By adjusting the length, width, and degree of overlap and separation of the various arms, the filtering characteristics of the unit structures 102 and 102', and the filtering device as a whole, can be altered. These adjustments have the effect of increasing or decreasing the inductive and capacitive coupling between the unit structures to control the frequency characteristics of the filter. More specifically, the described design and the adjustability of the arrangement of the various elements of the unit structures 102 and 102' permits control over the positions of the poles and zeros in the corresponding transmission spectrum of the filter device. These adjustments would allow the unit structures 102 and 102' to be "tuned" and modified to filter the desired target frequencies associated with the communication protocol used in a particular operating environment. For example, the inventors have found that the frequency of the maximum attenuation (i.e., the frequency at which blocking is desired) can be tuned across a range of frequencies by adjusting the degree of overlap between the corresponding arms of the tripole 106 and the secondary hexapole 110. The tuning characteristics are described in more detail in conjunction with FIGS. 2 and 3 below.

Figure 2:
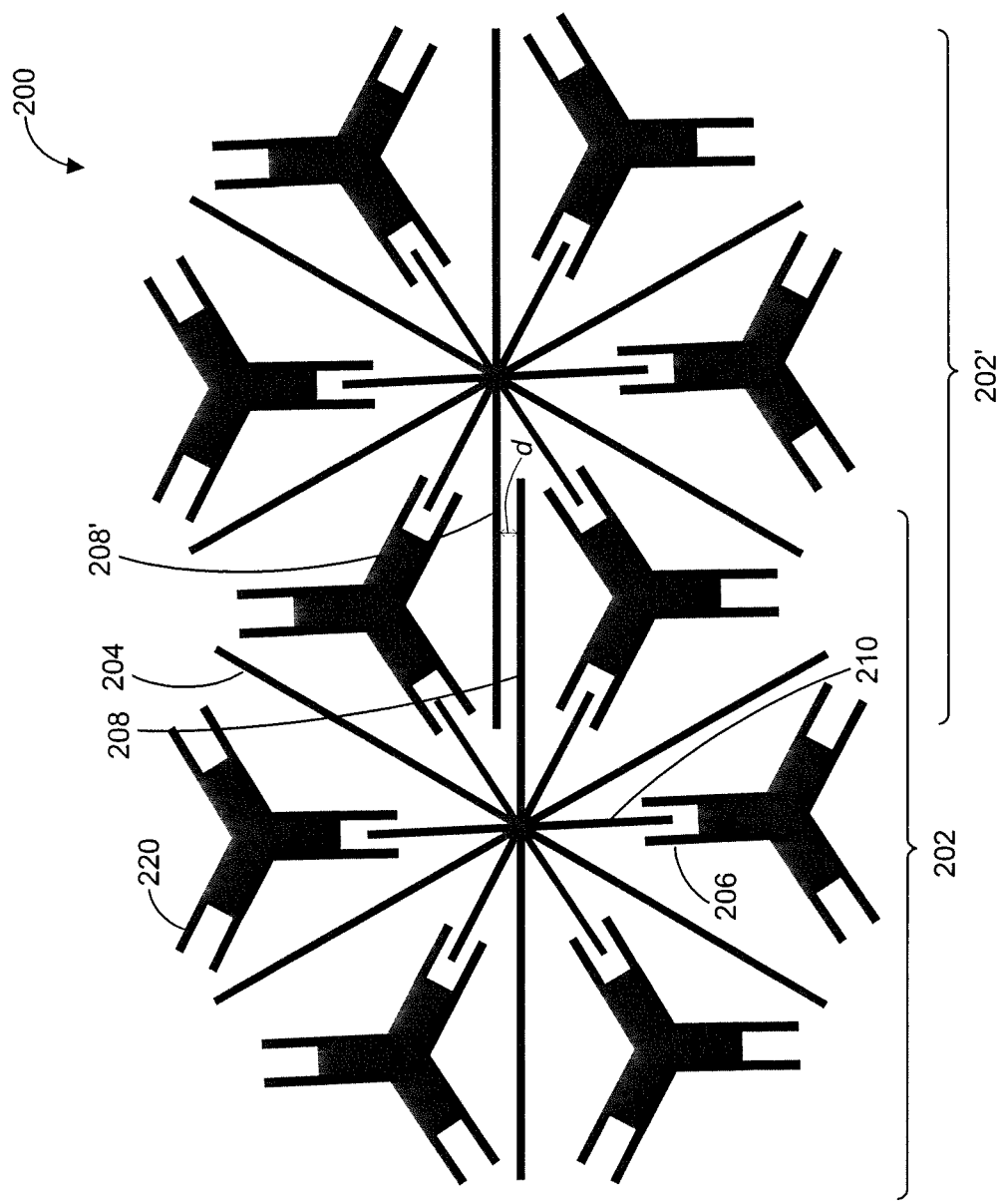
FIG. 2 is a plan view of a frequency-selective planar radio filter according to another embodiment of the invention.

FIG. 2 depicts a plan view of a planar structure 200 of a filter for blocking WiFi wireless network signals according to another embodiment. In the FIG. 2 embodiment, the planar structure 200 comprises two unit structures 202 and 202' in an interleaved arrangement operable to reduce the transmission of RF signals at the desired frequencies. This interleaved design can be repeated in multiple rows and columns in two dimensions to provide the desired planar filtering device. Similar to the embodiment of FIG. 1A, each unit structure 202 and 202' includes one centre-connected 12-pole star 204 and six centre-connected star-shaped tripoles 206. Each of the star-shaped structures includes arms or poles that extend radially from a common centre. The tripoles 206 are shared between adjacent 12-pole stars of adjacent unit structures 202 and 202'. The 12-pole star 204 can be considered to be made of two separate hexapole structures sharing a common centre. One hexapole 208 has longer arms, and is referred to as the "primary hexapole". The other hexapole 210 has shorter arms, and is referred to as the "secondary hexapole". The secondary hexapole 210 is shown to be angularly offset relative to the primary hexapole 208 so that the shorter arms of the secondary hexapole 210 are positioned between the longer arms of the primary hexapole 208. The tripoles 206 are shared between adjacent longer arms of the primary hexapole 208 of the 12-pole star 204. In the FIG. 2 embodiment, the widths of the arms of the 12-pole star 204 are equal or substantially equal with one another. Similarly to the FIG. 1A embodiment, the primary hexapole 208 and secondary hexapole 210 of FIG. 2 may be arranged as an array of multipole inclusions with "skewed" and/or "forked" poles.

In the embodiment of FIG. 2, at least a portion of the arms of the tripoles 206 are configured to have arm widths that are greater than the arm widths of the 12-pole stars 204. Further, the distal ends of each arm of the tripoles 206 are configured to define a fork 220 comprising two substantially parallel, spaced apart prongs, in which the distance between the parallel prongs is at least the width of the arms of the 12-pole stars 204. The parallel arrangement of the prongs permits maximization of the capacitance between overlapping segments given the minimum realizable gap widths of the manufacturing/printing process. The forked or pronged distal ends of the tripole arms represent a variation over the embodiment of FIG. 1A. As compared with the embodiment of FIG. 1A, higher capacitances in the frequency response of the design can be demonstrated using the embodiment of FIG. 2. Notwithstanding the fork 220, both the embodiments of FIG. 1A and FIG. 2 are based on the same underlying principles of operation. That is, interaction of the hexapole structures with the tripole 106 and forked tripole 206 operate to provide a secondary inductive-capacitive path between unit cells 102 and 102' or 202 and 202' of FIGS. 1A and 2, respectively. The tripoles 206 are centered at a position equidistant from the centers of the nearest three 12-pole stars 204.

In the embodiment of FIG. 2, at least one arm of a primary hexapole 208 is interleaved with at least one arm of another primary hexapole 208' of an adjacent unit structure 202'. The interleaved arms 208 and 208' are arranged to be substantially parallel to each other in a direction along a plane defined by these structures. Similarly to adjacent arms 108 and 108' of the FIG. 1A embodiment, arms 208 and 208' that are located adjacent and parallel to each other may be said to "overlap" with one another along a horizontal direction in a plane defined by these structures so as to provide for inductive-capacitive coupling between the adjacent conductive segments. In the present example, the amount of overlap of the arms 208 and 208' can be adjusted along the horizontal direction in the plane, and the degree of separation of the arms 208 and 208' can be adjusted in a direction transverse to the horizontal direction.

In respect of the tripoles 206, each arm of the secondary hexapole 210 is interleaved therewith. More specifically, as shown in the FIG. 2 embodiment, the distal portion of each arm of the secondary hexapole 210 (functioning as a capacitor finger) extends into the space between the two prongs (functioning as capacitor fingers) of fork 220 of tripole 206, thereby providing an inductive-capacitive path between the adjacent inclusions through these interdigitated capacitor fingers. In this embodiment, each arm of the secondary hexapole 210 is arranged so that it is oriented substantially parallel to the prongs of the corresponding interleaving fork 220.

In alternate embodiments, unit structures 102, 102' and 202, 202' may be replaced with primary and secondary quadropole structures, instead of hexapole structures 108, 108' as shown in FIGS. 1A and 2. Similarly to the FIGS. 1A and 2 embodiments, these quadropole structures may be arranged in a "forked" and "skewed" pole configuration, with overlapping conductive segments of adjacent structures providing an inductive-capacitive coupling of the structures. Tripole structures may be interleaved between these quadropole structures to provide a secondary inductive-capacitive path between the structures.

Figure 3:
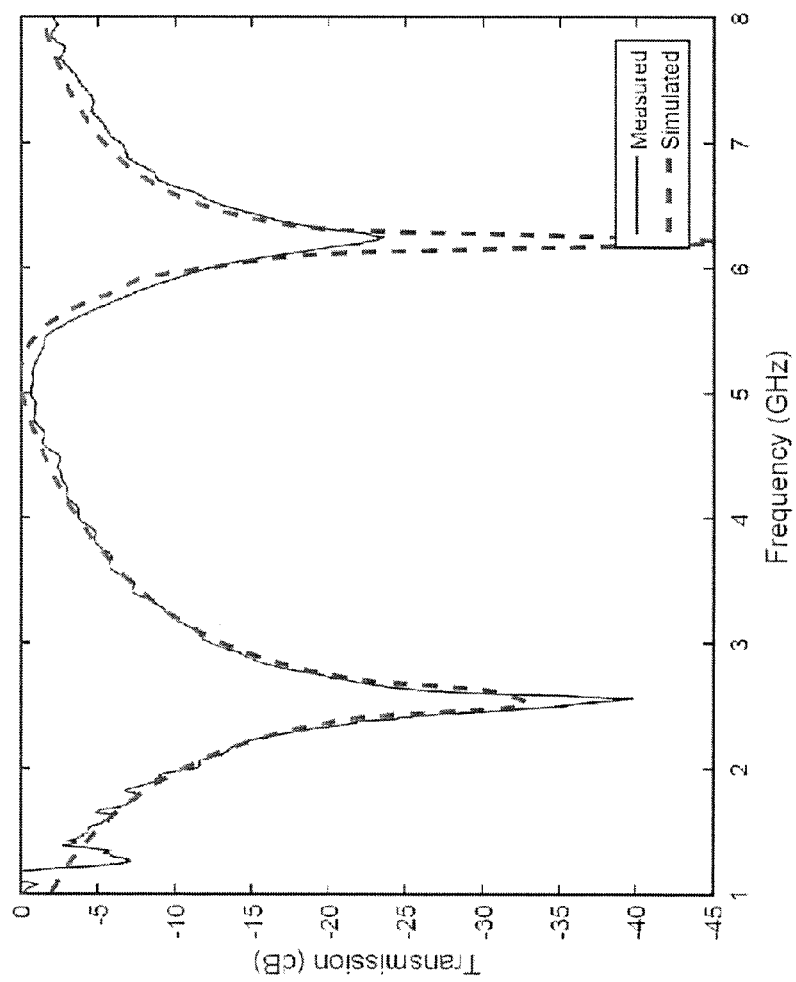
FIG. 3 is a graph of the measured and simulated transmission spectrum of the frequency-selective radio filter of FIG. 1A.

FIG. 3 is a diagram depicting the RF transmission spectrum, as a function of frequency, of the filter design associated with filter device of FIG. 1A. The dotted line represents the simulated frequency response and the solid line represents the experimentally measured frequency response of the design, as obtained through the setup and procedures described in more detail below.

Experimental measurements of the transmission spectrum can be carried out using methods known to those skilled in the art. For example, in one experimental setup, two high bandwidth (900-12000 MHz) tapered slot antennas or Vivaldi antennas are connected to a vector network analyzer (R&S® ZVA67). Each antenna is then positioned within an anechoic chamber (4'×4'×6' in size) that is lined with absorbing foam to attenuate background noise and reflections of the chamber's surfaces. A 4'×4' insulating foam board set with a 1.5'×1.5' prototype WiFi blocking wallpaper having printed thereon the filtering structure of FIG. 1A (or, similarly, FIG. 2) is positioned between the antennas so that each antenna is set 2'4" away from the prototype wallpaper on each side. Regions of the foam board surrounding the 1.5'×1.5' prototype WiFi blocking wallpaper can be further covered with aluminum foil to ensure all RF signals would propagate only through the prototype wallpaper.

The measurement procedure used to generate the transmission spectrum of FIG. 3 involved obtaining 2000 frequency readings between the start and stop frequencies of 1 GHz and 8 GHz. During each frequency reading, a first antenna on one side of the WiFi blocking wallpaper transmits an RF signal that propagates along the anechoic chamber, through the wallpaper, and is received by a second antenna located at the opposite side of the wallpaper. Upon receiving the RF signal, the strength or power of the received signal is measured and compared against the power of the transmitted RF signal to determine the degree of attenuation achievable using the wallpaper. The attenuation is plotted as a function of the frequency of the transmitted RF signal.

A simulated transmission spectrum can be generated by modeling the above-described experimental set up using known computer-based modeling techniques. For example, the COMSOL Multiphysics® finite element analysis solver software can be used to carry out the simulation. The simulation parameters can include defining a simulation domain consisting of one unit cell of the filter design. The sides of the wallpaper can be modeled by periodic boundary conditions to simulate its infinite periodic nature. Wave ports can be positioned above and below the wallpaper to measure the transmitted power. Perfectly matched layers can be positioned behind each wave port to absorb all scattered waves. These methods predict the propagation of electromagnetic energy at the specified frequencies between an RF source and an RF receiver.

The transmission spectrum of FIG. 3 shows that the WiFi blocking wallpaper described herein provides reduced transmission at two resonance poles or resonance frequencies: a lower resonance frequency (primary pole) and an upper resonance frequency (secondary pole). In certain embodiments, the lower resonance frequency is centred around 2.5 GHz and the upper resonance frequency around 6.2 GHz. The maximum simulated and measured attenuations were −32 dB and −39 dB, respectively, at the lower resonance frequency, and −44 and −23 dB, respectively, for the upper resonance frequency. For each of the of the resonance frequencies, the simulated and measured −20 dB bandwidth (the "stop band") were 381 MHz and 395 MHz, respectively, for the lower resonance frequency, and 193 MHz and 143 MHz, respectively, for the upper resonance frequency. Specifically, the interleaved hexapole structure has a 15.5% bandwidth at the primary resonance for the structure of FIG. 1A (i.e., with a non-forked tripole 106) and 15.3% for the structure of FIG. 2 (i.e., with a forked tripole 206). For the secondary resonance, the bandwidths are 2.3% and 4.9%, respectively. The bandwidths of the primary resonances of the described strictures are therefore comparatively large, being greater than 15%. For example, the tripole-based "metapaper" structure described in U.S. Pat. No. 9,065,180 has a 13.0% bandwidth at the primary band of operation and 8.9% in the secondary band. The equivalent full-width half max (FWHM) simulated and measured stop bands are 150 MHz and 59 MHz, respectively, for the lower resonance frequency, and 52 MHz and 151 MHz, respectively, for the upper resonance frequency. It is noted that representation of the stop band using the −20 dB bandwidth instead of the FWHM bandwidth may be more suitable in some cases because highly resonant structures with low losses often show large variations in simulated and maximum levels that generally result in inconsistent FWHM bandwidth measurements.

Figure 4:
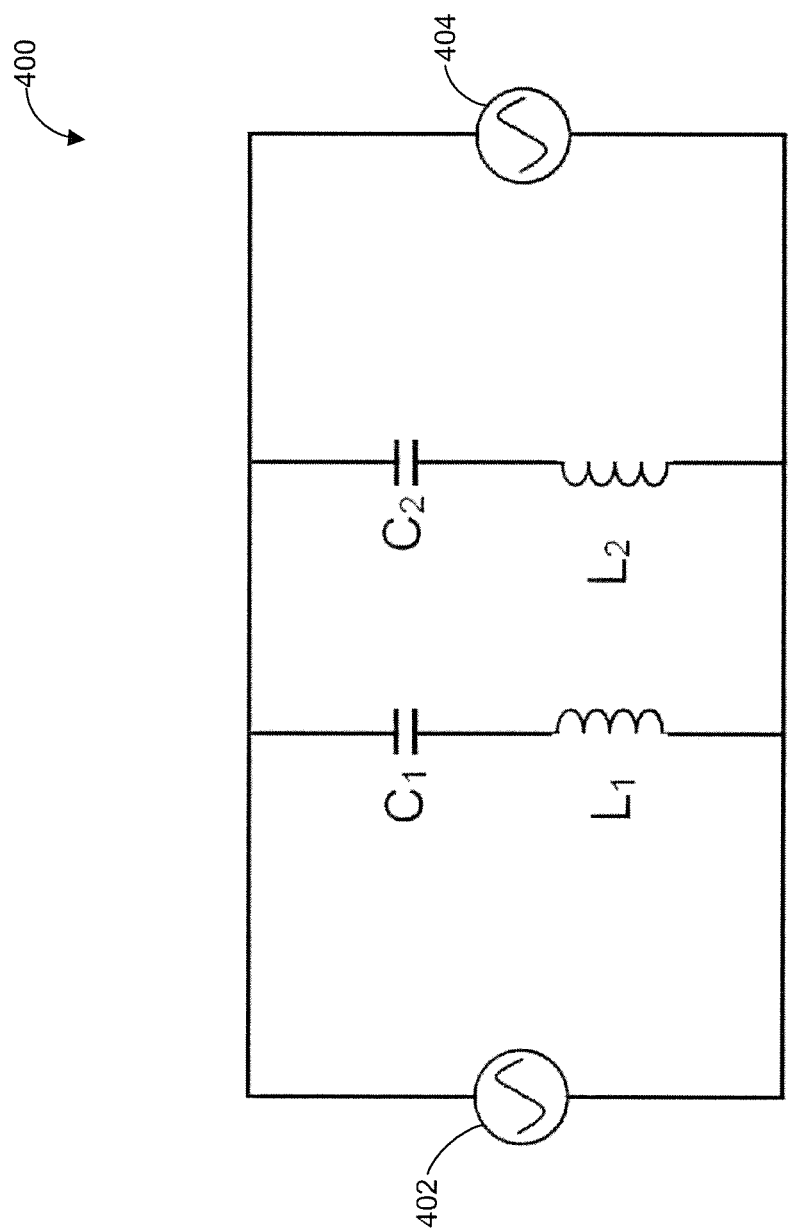
FIG. 4 is a diagram of the simulated electric fields of the 12-pole stars of FIG. 1A.
Figure 5:
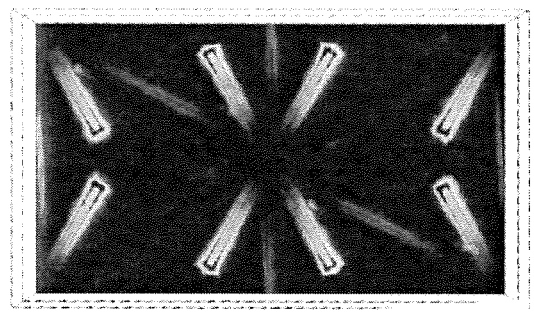
FIG. 5 is the equivalent circuit diagram of the 12-pole star of FIG. 1A.
Figure 5:
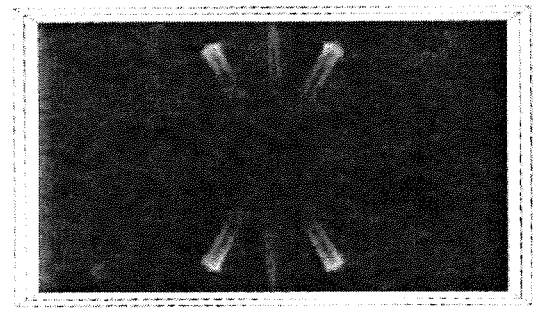
Figure 5:
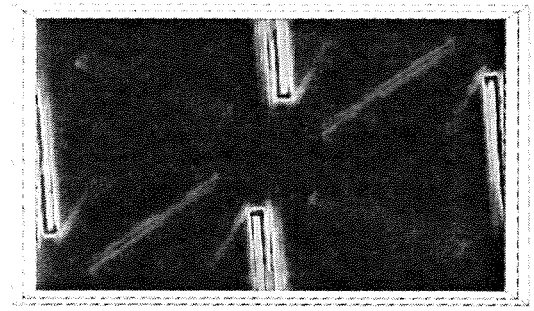

As noted previously, the design of the filtering structure 100 permits adjustments to "tune" the filter, for example, by adjusting the degree of overlap between the arms of the various elements in the unit structures 102 and 102'. Specifically, the adjustments of the overlap can alter the LC paths that can be created to enable optimization of the filtering structure 100 to the desired frequencies. For example, considering, for now, only at the 12-pole star 104 comprising the primary and secondary hexapoles 108 and 110, the frequency response can be modeled by a purely reactive simple series parallel LC network 400 as illustrated in FIG. 4, with a signal input port 402 and a signal output port 404. FIG. 5 shows the simulated electric field diagrams of interleaved 12-pole stars 104 (i.e., FIG. 1A without the tripoles 106) in which the primary hexapole 108 is active at the first transmission zero and the secondary hexapole 110 is active at the second transmission zero, while neither is comparatively active at the transmission pole. The equivalent impedance of the LC network 400 provides the position of the transmission poles as a function of the inductive and capacitive elements L1, L2, C1, and C2 as:

$$\omega_p^2 = \frac{(C_1 + C_2)}{C_1 C_2 (L_1 + L_2)}$$

Under the condition where the first transmission zero is substantially less than the second transmission zero $\omega_{Z1} \ll \omega_{Z2}$ the above relation can be simplified as:

$$\omega_p^2 = \omega_{Z1}^2 \frac{1}{L_1 C_2}$$

Accordingly, filtering structure 100 can be tuned by altering the degree of overlap and distances to obtain the desired inductive and capacitive values.

The above-described adjustments permit relatively straight-forward control of the positions of the poles and zeros in the transmission spectrum thereby allowing a wide tunability range. More specifically, the primary resonances can be changed by changing the length of the primary hexapole, the secondary resonance can be changed by changing the length of the secondary hexapole, and the position of the transmission maximum can be changed by changing the overlap between arms. In general, as the degree of overlap between the arms of the tripoles 106 and secondary hexapoles 110 is increased, the second stop band at the upper resonance frequency moves down in frequency along with the position of maximum transmission between the first stop band at the lower resonance frequency and the second stop band at the upper resonance frequency. Table 1, below, summarizes the geometric parameters used in the measured prototype WiFi blocking wallpaper used to generate the transmission spectrum of FIG. 3.

TABLE 1

| Reference numeral | Description | Measurement |
|---|---|---|
| 108, 108', 208 and 208' | Length of primary hexapole arm | 2.016 cm |
| 108, 108', 208 and 208' | Width of arm | 0.5 mm |
| 110 and 210 | Length of secondary hexapole arm | 9.66 mm |
| 208 and 210 | Angular offset between primary and secondary hexapoles | 37 degrees |
| 102 and 102' | Displacement between centres of two | 2.566 cm |

TABLE 1-continued

| Reference numeral | Description | Measurement |
|---|---|---|
| 202 and 202' | 12-pole stars in the x direction | |
| 102 and 102' 202 and 202' | Displacement between two 12-pole stars in the y direction | 1.34 mm |
| 108 and 108' 208 and 208' | Gap d that separates the primary hexapole arms | 0.8 mm |
| 106 and 206 | Length of tripole arms | 7.56 mm |
| 206 and 210 | Overlap length of the tripole arm and secondary hexapole arm | 2.4 mm |

Given the geometric parameters listed in Table 1, the FSS has a lower resonance frequency at 2.8 GHz with 15% bandwidth (−20 dB) and a higher resonance frequency at 7.3 GHz with 3% bandwidth (−20 dB). When printed on a PET sheet with a thickness of 150 μm, the two resonance frequencies move to 2.5 GHz and 6.2 GHz as shown in FIG. 3.

In particular embodiments, the lengths of the longer arms of the primary hexapole 108 are selected to be approximately one-sixth of the wavelength of the resonant frequency of the primary hexapole 108 (i.e., the primary resonance frequency for which maximum attenuation is desired). As previously noted, the arms of the primary hexapole 108 may be considered the primary resonance branch. In particular embodiments, the lengths of the shorter arms of the secondary hexapole 110 are selected to be approximately one-fifth of the wavelength of the secondary hexapole's 110 resonant frequency (i.e., the secondary resonance frequency for which maximum attenuation is desired). The arms of the secondary hexapole 110 may be considered the secondary resonance branch. The ratio between the arms of the primary hexapole 108 and secondary hexapole 110 is approximately the ratio desired between the positions of the two stop bands. These lengths may vary if the capacitance between adjacent primary hexapoles 108 changes (e.g., different gap spacings or different degrees of overlap).

With respect to the tripoles 106, the lengths of the arms of the tripoles 106 may be limited by the space available between the arms of the primary hexapole 108. While the secondary resonance frequency does not strongly depend on the ratio of lengths between the corresponding arms of the secondary hexapole 110 and the tripole 106, placing the region of overlap of these arms midway between the centres of the secondary hexapoles 110 and centres of the tripoles 106 may be useful in avoiding higher-order interactions between the primary resonance branch and the secondary resonance branch. As such, a one-to-one ratio may be suitable.

In view of the foregoing, a complete multi-band FSS filtering device can be fabricated by providing a periodic array of multipole inclusions (e.g. unit structures 102 and 202). These inclusions may comprise an arrangement of primary and secondary hexapoles 108, 110 (FIG. 1A) and 208, 210 (FIG. 2). The multiple inclusions may provide skewed or forked poles to maximize packing density. This increases inductive-capacitive coupling between adjacent unit structures, which leads to higher filtering bandwidths. The hexagonal symmetry also provides polarization independence at normal incidence. The use of primary and secondary resonance paths with tightly confined fields also enables each resonance frequency to be tuned independently. The inclusions can have four or six primary poles to generate the lower frequency resonance with an additional four or six secondary poles to generate the higher frequency resonance. The secondary poles (e.g. tripole 106 and 206) are independently tunable relative to the primary poles to tune the higher frequency resonance. Skewing the lattice or forking the poles provides long parallel conducting segments that are interleaved to maximize capacitance between adjacent inclusions. Furthermore, secondary inclusions, such as tripoles 206, may be included in the space between the primary multiple inclusions to tune the higher resonance frequency. While the inclusions are skewed or forked in certain described embodiments, other embodiments may employ non-forked multi-pole elements.

Figure 6:
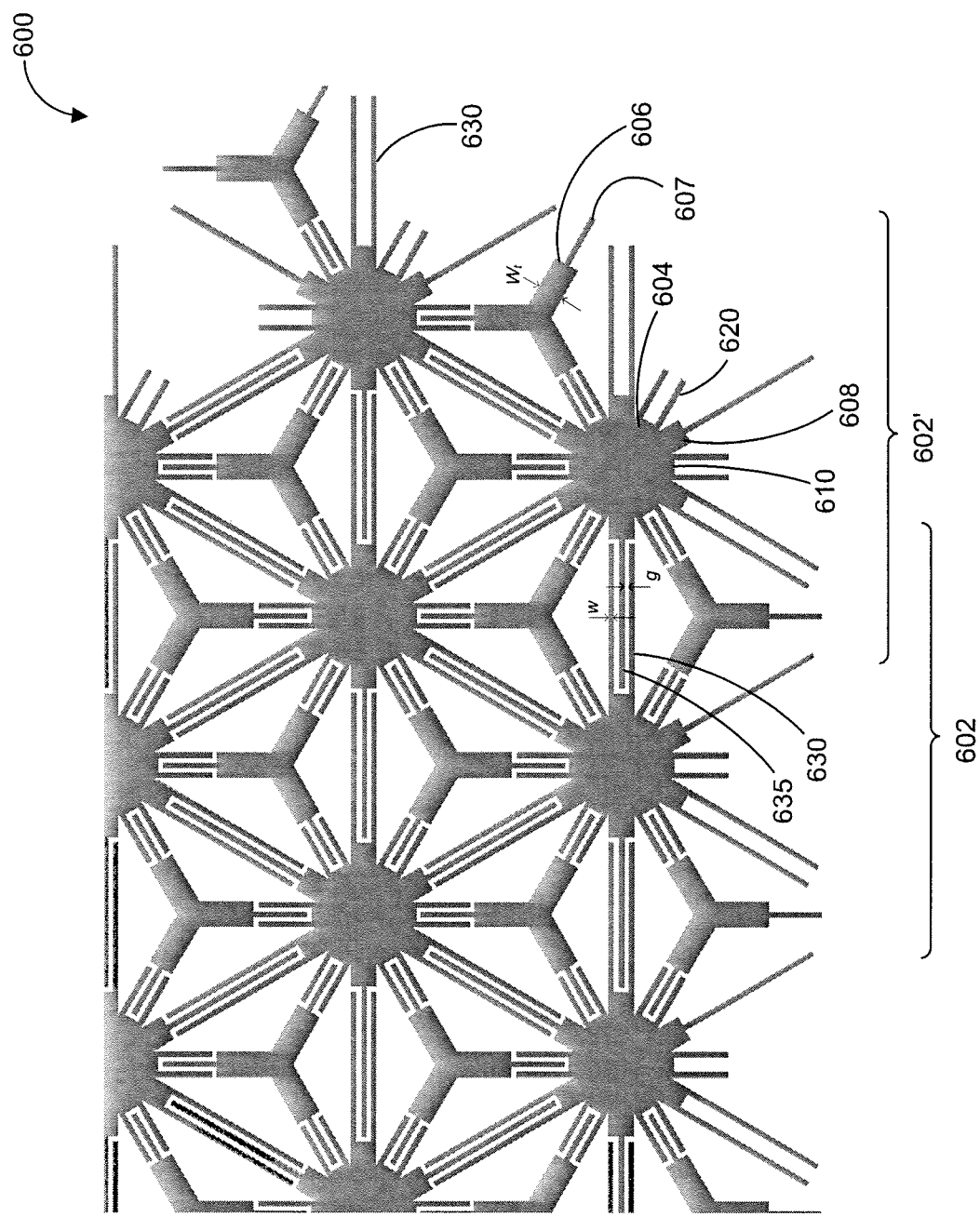
FIG. 6 is a plan view of a frequency-selective planar radio filter according to another embodiment of the invention.

FIG. 6 depicts a plan view of an embodiment of another planar structure 600 for use as a filter for blocking WiFi wireless network signals. Although the bandwidth at the lower resonance frequency of the previously disclosed filters is greater than corresponding bandwidths of existing published designs, the bandwidth at the higher resonance frequency is smaller. The planar structure 600 for use in an FSS is designed to maximize the bandwidths at both resonance frequencies simultaneously.

Maximization of the bandwidth at both resonance frequencies can be accomplished by increasing the capacitive overlap between adjacent elements, as described below.

In the embodiment of FIG. 6, the planar structure 600 comprises unit structures 602 and 602' in an interleaved arrangement which is repeated along multiple rows and columns in two dimensions to provide the desired planar filtering device. Similar to the embodiment of FIG. 2, each unit structure 602 and 602' includes one centre-connected 12-pole star 604 and six centre-connected star-shaped tripoles 606, the tripole 606 having a body thickness denoted in FIG. 6 by $W_r$. Each of the star-shaped structures includes arms or poles that extend radially from a common centre. The tripoles 606 are shared between adjacent 12-pole stars 604 of adjacent unit structures 602 and 602'. The 12-pole star 604 can be considered to be made of two separate hexapole structures sharing a common centre. Similar to the design of FIG. 2, one hexapole 608 has longer arms, and is referred to as the "primary hexapole". The other hexapole 610 has shorter arms, and is referred to as the "secondary hexapole". The secondary hexapole 610 is shown to be angularly offset relative to the primary hexapole 608 so that the shorter arms of the secondary hexapole 610 are positioned between the longer arms of the primary hexapole 608.

The centre of the 12-pole star 604 of the present embodiment is substantially larger than the centre of the 12-pole star 204 of FIG. 2. More specifically, the centre of the 12-pole star 604 comprises a substantially circular body with the hexapole arms extending radially therefrom. Each arm of secondary hexapole 610 is also skewed to produce a fork 620 comprising two substantially parallel, spaced apart prongs. The spacing of the prongs is configured so that pole 607 receives an adjacent tripole 606 as shown. One half of the poles of the primary hexapole 608 is skewed to produce an extended fork 630 while the opposing pole (i.e., the corresponding pole that extends radially in the opposite direction along the same general direction or axis) is not skewed and comprises a single "finger" 635 extending radially outward from the centre. The finger 635 (functioning as a capacitor finger) of one primary hexapole 604 of one unit structure 602 is positioned between the fork 630 (functioning as capacitor fingers which together with finger 635 are interdigitated capacitors providing an inductive-capacitive path between the adjacent inclusions) of another primary hexapole 604 of another unit structure 602' as shown in FIG. 6. The gap between a fork and a finger is denoted by g in FIG. 6 and the thickness of the prongs of the fork 630 is denoted in FIG. 6 by w. In this configuration, the degree of overlap is increased to enable maximization of bandwidth at both resonant frequencies.

Figure 7:
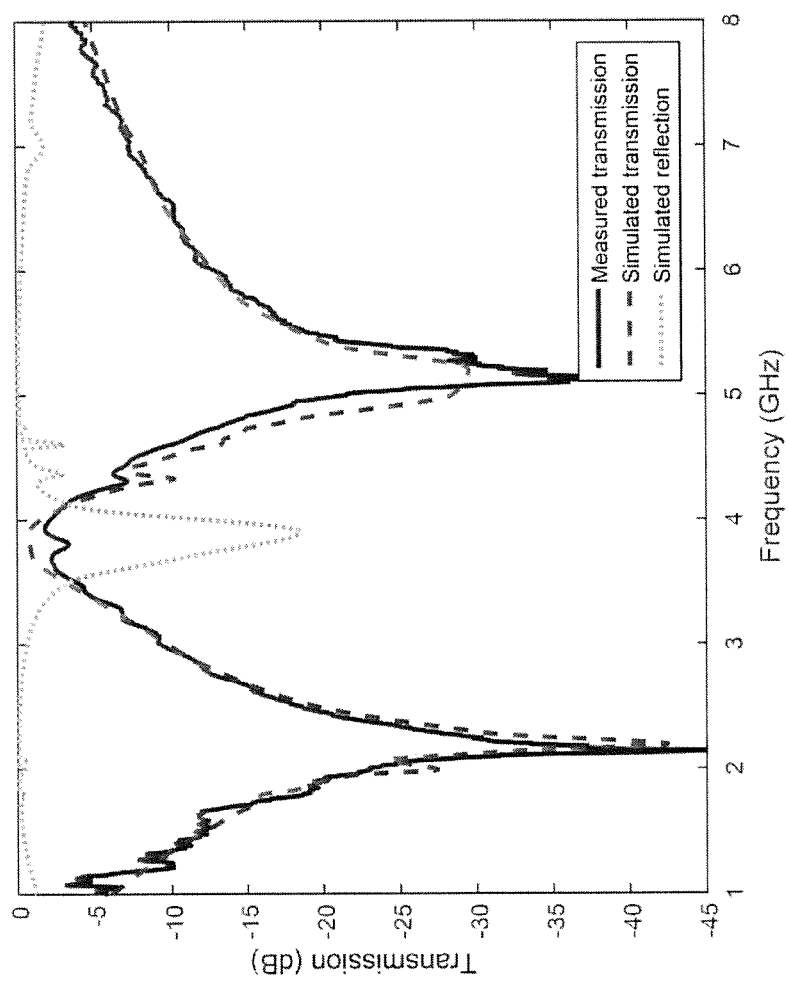
FIG. 7 illustrates the RF transmission (measured and simulated) and reflection (simulated) spectra, as a function of frequency, of the filter design associated with the FIG. 6 embodiment.

FIG. 7 is a diagram depicting the RF transmission (measured) and reflection (measured and simulated) spectra, as a function of frequency, of the filter design associated with the filter device of FIG. 6 using the geometries outlined in Table 2 below. The dotted line represents the simulated frequency response and the solid line represents the experimentally measured frequency response of the design, as obtained through the setup and procedures described above. The experimental measurements of the transmission spectrum show that the embodiment of FIG. 6 produces a first stop band at the lower resonance frequency of 2.6 GHz with a 22.5% bandwidth (−20 dB) and a second stop band at the higher resonance frequency of 6.0 GHz with a 9.5% bandwidth (−20 dB). The bandwidth at the higher resonance frequency is greater compared to the corresponding bandwidths of 2.3% and 4.9% for the embodiments of FIGS. 1A and 2, respectively. When the pattern is printed on a 125 μm PET sheet, the two stop bands move to 2.14 GHz and 5.13 GHz.

TABLE 2

| Reference numeral | Description | Measurement |
|---|---|---|
| 630 and 635 | Length of primary hexapole arm (from centre of the unit structure to the tip) | 2.185 cm |
| 620 | Length of secondary hexapole arm (from centre of the unit structure to the tip) | 10.45 mm |
| 608 and 610 | Angular offset between primary and secondary hexapoles | 30 degrees |
| 602 and 602' | Displacement between centres of two 12-pole stars in the x direction | 2.945 cm |
| 602 and 602' | Displacement between two 12-pole stars in the y direction | 2.550 cm |
| 630 and 635 | Gap g that separates the primary hexapole fork and finger | 0.5 mm |
| 630 | Width w of the of the primary hexapole fork | 0.5 mm |
| 607 | Length of tripole arms (from centre to the tip) | 11.30 mm |
| 606 | Thickness of the tripole body $W_t$ | 1.5 mm |
| 607 and 620 | Overlap length of the tripole arm and secondary hexapole arm | 4.75 mm |
| 630 and 635 | Overlap length of primary hexapole fork and finger | 14.25 mm |

The examples and corresponding diagrams used herein are for illustrative purposes only. Different configurations and terminology can be used without departing from the principles expressed herein.

Although the invention has been described with reference to certain specific embodiments, various modifications thereof will be apparent to those skilled in the art without departing from the scope of the invention. The scope of the claims should not be limited by the illustrative embodiments set forth in the examples, but should be given the broadest interpretation consistent with the description as a whole.

The invention claimed is:

1. A planar radio frequency filter comprising a frequency selective surface (FSS) configured to block the transmission of electromagnetic waves in at least two independent radio frequency bands, the FSS comprising a periodic array of multipole inclusions, wherein the periodic array of multipole inclusions comprise four or six primary poles to generate a lower frequency resonance and an additional four or six secondary poles to generate a higher frequency resonance, wherein the periodic array of multipole inclusions comprise parallel overlapping conducting segments between adjacent inclusions to provide an inductive-capacitive path between the adjacent inclusions.

2. The filter of claim 1, comprising a flexible or rigid non-conductive substrate, wherein the FSS is disposed on the substrate and wherein the substrate comprises one or more of paper, textile, vinyl, acrylic and plastic, and the filter is applied as wallpaper to a wall.

3. The filter of claim 2, wherein the substrate comprises polyethylene terephthalate (PET).

4. The filter of claim 2, wherein the periodic array of multipole inclusions are arranged with skewed poles to increase packing density of the periodic array of multipole inclusions.

5. The filter of claim 2, wherein the periodic array of multipole inclusions comprise primary inclusions and secondary inclusions, the secondary inclusions located between the primary inclusions to tune the higher frequency resonance.

6. The filter of claim 5, wherein the primary and secondary inclusions are arranged to have a common center.

7. The filter of claim 6, wherein respective poles of the primary and secondary inclusions extend from the common center.

8. The filter of claim 6, wherein at least one pole of the primary inclusions is positioned in a parallel and overlapping arrangement with a corresponding pole associated with primary inclusions of an adjacent set of multipole inclusions.

9. The filter of claim 6, wherein the secondary inclusions are angularly offset relative to the primary inclusions.

10. The filter of claim 9, wherein an angular offset of the secondary inclusions relative to the primary inclusions is 37°.

11. The filter of claim 9, wherein an angular offset of the secondary inclusions relative to the primary inclusions is 30°.

12. The filter of claim 6, wherein poles of the primary inclusions are longer than poles of the secondary inclusions.

13. The filter of claim 6, wherein the periodic array of multipole inclusions comprise a plurality of tripoles and wherein at least one pole of each tripole is interleaved with a pole of the secondary inclusions in a parallel and overlapping arrangement.

14. The filter of claim 13, wherein each of the plurality of tripoles comprises forked pole elements with two substantially parallel and spaced apart prongs.

15. The filter of claim 14, wherein the pole of the secondary inclusions is positioned between the spaced apart prongs in a parallel and overlapping arrangement.

16. The filter of claim 5, wherein at least one of the primary and secondary inclusions comprises forked or non-forked elements.

17. The filter of claim 16, wherein each of the secondary inclusions comprise forked pole elements with two substantially parallel and spaced apart prongs.

18. The filter of claim 16, wherein a first set of poles of the primary inclusions each have a corresponding forked pole element with two substantially parallel and spaced apart prongs and a second set of poles of the primary inclusions each have a corresponding non-forked element.

19. The filter of claim 18, wherein a pole with the forked pole element in the first set of poles is positioned between two poles with the non-forked element of the second set of poles, and a pole with the non-forked element of the second set of poles is positioned between two poles with the forked pole element of the first set of poles.

20. The filter of claim 18, wherein a non-forked element of a primary inclusion of an adjacent set of multipole inclusions is positioned between two spaced apart prongs of a pole of the first set of poles in a parallel and overlapping arrangement.

21. The filter of claim 17, wherein the periodic array of multipole inclusions comprise a plurality of tripoles and wherein at least one pole of each tripole is positioned between corresponding spaced apart prongs of a secondary inclusion in a parallel overlapping arrangement.

22. The filter of claim 5, wherein each of the primary and secondary inclusions is arranged in a hexapole structure.

23. The filter of claim 1 wherein the inductive-capacitive path is provided between the adjacent inclusions by way of interdigitated capacitor fingers.

24. A method for manufacturing a filter to selectively block transmission of electromagnetic waves, the method comprising:
providing a non-conductive planar substrate; and
applying a conductive frequency selective surface (FSS) to the planar substrate, wherein the FSS is configured to block the transmission of electromagnetic waves in at least two independent radio frequency bands, the FSS comprising a periodic array of multipole inclusions, the periodic array of multipole inclusions having four or six primary poles to generate the lower frequency resonance and an additional four or six secondary poles to generate the higher frequency resonance, wherein the periodic array of multipole inclusions comprise parallel overlapping conducting segments between adjacent inclusions to provide an inductive-capacitive path between the adjacent inclusions.

25. The method of claim 24, wherein the substrate comprises one or more of a sheet of paper, textile, vinyl, acrylic and plastic.

26. The method of claim 25, wherein the substrate comprises polyethylene terephthalate (PET).

27. The method of claim 25, wherein applying the FSS to the substrate comprises printing the FSS on the substrate using a printer with conductive ink.

28. The method of claim 27, wherein the printed FSS comprises the periodic array of multipole inclusions printed along at least one row and at least one column on the substrate.

29. The method of claim 24, wherein the periodic array of multipole inclusions comprise skewed poles to increase packing density.

30. The method of claim 24, comprising providing secondary inclusions located between primary inclusions to tune the higher frequency resonance.

31. The method of claim 30, wherein at least one of the primary and secondary inclusions comprises forked or non-forked multipole elements.

* * * * *